United States Patent [19]
Kiriyama

[11] Patent Number: 5,856,988
[45] Date of Patent: Jan. 5, 1999

[54] METHOD AND APPARATUS FOR DATA TRANSMISSION

[75] Inventor: Takashi Kiriyama, Tokyo, Japan

[73] Assignee: NEC Corporation, Tokyo, Japan

[21] Appl. No.: 620,494

[22] Filed: Mar. 22, 1996

[30] Foreign Application Priority Data

Mar. 23, 1995 [JP] Japan .................................. 7-063831

[51] Int. Cl.$^6$ ................................................. H03M 13/00
[52] U.S. Cl. ........................... 371/41; 371/2.1; 371/37.4
[58] Field of Search ........................... 371/41, 37.4, 2.1; 370/218, 94.3, 321, 324, 347, 479; 514/161

[56] References Cited

U.S. PATENT DOCUMENTS

| | | | |
|---|---|---|---|
| 4,282,215 | 8/1981 | Hyodo et al. | 514/161 |
| 5,285,441 | 2/1994 | Bansal et al. | 370/218 |
| 5,506,847 | 4/1996 | Shobatake | 370/94.3 |

FOREIGN PATENT DOCUMENTS

| | | |
|---|---|---|
| 1-119135 | 5/1989 | Japan . |
| 1-119136 | 5/1989 | Japan . |
| 3-159421 | 7/1991 | Japan . |

*Primary Examiner*—Reba I. Elmore
*Assistant Examiner*—McDieunel Marc
*Attorney, Agent, or Firm*—Scully, Scott, Murphy and Presser

[57] ABSTRACT

A transmitter selectively encodes or does not encode a data frame to be transmitted with an error correcting code depending on the congestion and occurrence of bit errors of a transmission path, and transmits the data frame with decision information indicative of whether the data frame has been encoded with the error correcting code or not for preventing either bit error or cell loss not. A receiver determines whether the received data frame has been encoded with the error correcting code or not based on the decision information sent with the data frame. The receiver decodes the data frame which has been encoded with the error correcting code, and outputs a decoded frame length, or delays the data frame which has not been encoded with the error correcting code for a delay time corresponding to the length of a preceding data frame and adds the data frame in a time series sequentially. The receiver then decodes the data frame into original data.

5 Claims, 4 Drawing Sheets

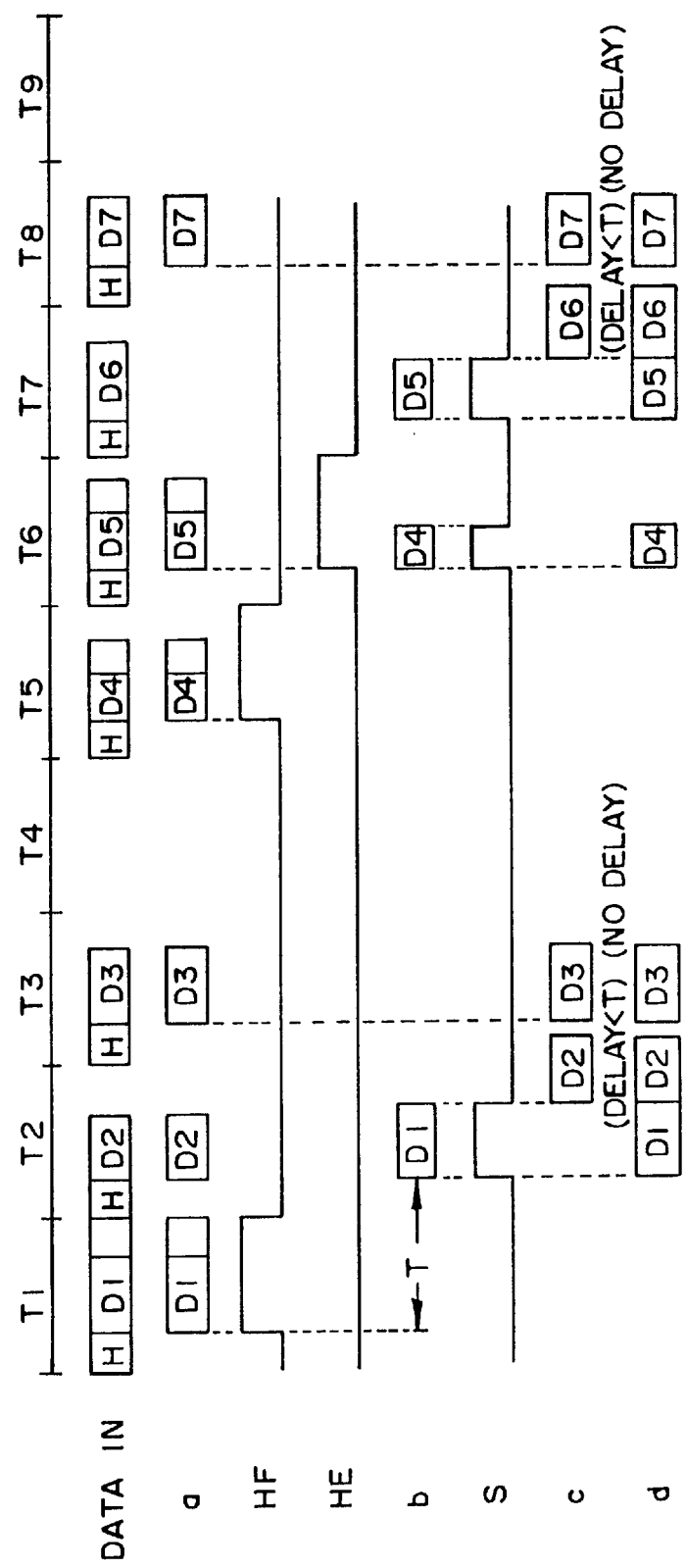

METHOD AND APPARATUS FOR DATA TRANSMISSION

BACKGROUND OF THE INVENTION

1. Field of the Invention

The present invention relates to a data transmission system, and more particularly to a method of and an apparatus for data transmission in an ATM (Asynchronous Transfer Mode) communication system according to defined standard B-ISDN (Broad Integral Service Digital Network).

2. Description of the Related Art

According to one conventional data transmission system, as shown in FIG. 1 of the accompanying drawings, a receiver has an error detecting circuit 8 for detecting the number of error bits and an error correcting circuit group 7 which is controlled by an optimum error correcting encoding circuit that is selected by the error detecting circuit 8 based on the detected number of error bits. Error detecting circuit 8 transmits information representing the selected optimum error correcting encoding circuit to a transmitter for controlling error correcting encoding circuit group 6, in a mode to coordinate with the receiver. For details of such a conventional data transfer system, reference should be made to Japanese laid-open patent publication No. 159421/1991.

FIG. 2 shows another conventional data transmission system. In FIG. 2, when a data error is detected by error detecting circuit 11 of a receiver, retransmission request output circuit 12 of the receiver outputs and transmits a retransmission request to a transmitter. The number of produced retransmission requests is counted by counters 10T, 10R provided in the transmitter and receiver respectively. Based on the count, error correcting encoding circuit group 9 of the transmitter and error correcting circuit group 13 of the receiver are controlled in coordination with each other. For details of such a conventional data transfer system, reference should be made to Japanese patent laid-open publications Nos. 119135/1989 and 119136/1989.

In an ATM network available for B-ISDN, an error rate and a state of congestion in the network are recognized by a transmitter of a transmitting apparatus based on network management information that is represented by information obtained from OAM (operation and maintenance) functions prescribed by (International Telecommunication Union-Telecommunications Sector) Recommendations.

If the network is determined as being not congested, then data are transmitted without an error correcting encoding process, so that the data can be transmitted with an increased transmission efficiency at an increased transmission rate by avoiding redundancy bits and a transmission delay that would be introduced by an error correcting encoding process. If the network is determined as being congested or suffering many data errors, then depending on the degree to which the network is congested or suffering data errors, the data are subjected to either an error correcting encoding process for bit errors or a powerful error correcting encoding process for a cell loss while sacrificing transmission efficiency. Therefore, depending on the contents of the data to be transmitted or the application to which the data are used, it is possible for a transmitter to effect an optimum control operation, operating a receiver as a slave to the control of the transmitter.

However, the above data transmission process cannot be realized by the conventional data transfer systems shown in FIGS. 1 and 2 in which the quality of transmitted data is monitored by the receiver and the receiver controls the error correcting encoding circuit of the transmitter. Another problem of the conventional data transfer systems is that the above data transfer process cannot be carried out by one-way communications because control information of the receiver cannot be transmitted by one-way communications.

SUMMARY OF THE INVENTION

It is an object of the present invention to provide a method of and an apparatus for transferring data in a data transmission system which has a transmitter for selectively transmitting data that have been encoded with an error correcting code and data that have not been encoded with an error correcting code, depending on the conditions of a transmission path, and a receiver for independently decoding the data based on decision information indicative of whether the data have been encoded or not.

According to the present invention, there is provided a method of and apparatus for transferring data with decision information multiplexed in a data frame, the decision information indicates whether the data have been encoded with an error correcting code having a redundant bit or not, comprising the steps of adding a code indicating whether data have been encoded with an error correcting code for preventing a cell loss or a bit error, to the decision information in a transmitter, checking the decision information at a corresponding receiver to determine whether the received data have been encoded with an error correcting code or not, decoding the data from the error correcting code and outputting the decoded data and frame length information indicative of the length of the data frame after the data have been decoded, delaying received data which have been encoded without an error correcting code, for the frame length corresponding to the frame length information of a preceding data frame at the receiver, arranging and outputting the decoded data and the delayed data in a time series sequentially, and decoding the data arranged and outputted in the time series into original data.

The step of decoding the data from the error correcting code may comprise the step of alternatively decoding the data from error correcting codes for preventing a cell loss with respect to ATM and packet cells and a bit error.

The decoder for decoding the data from the error correcting code may comprise a cell-loss-error correcting code decoder, a bit-error correcting code decoder, and a selector for alternatively selecting and outputting either the output signals from the cell-loss-error correcting code decoder or the bit-error correcting code decoder corresponding to the decision information.

In the data transfer method according to the present invention, the receiver determines whether a received data frame has been encoded with an error correcting code or not based on the decision information. The receiver decodes the data from the error correcting code if they have been encoded with the error correcting code, or does not decode the data from the error correcting code if they have not been encoded with the error correcting code, and delays the data for the frame length corresponding to the length of a preceding frame. The receiver arranges and outputs the delayed data in a time series sequentially. Thereafter, the receiver decodes the data into original data. The receiver thus independently decodes data which have been encoded with an error correcting code or not.

The above and other objects, features, and advantages of the present invention will become apparent from the following description with reference to the accompanying drawings which illustrate examples of the present invention.

BRIEF DESCRIPTION OF THE DRAWING

FIG. 5(a) is a diagram of a data frame used in the apparatus for transferring data according to the present invention;

FIG. 5(b) is a diagram showing a time sequence of changes of signals in a data frame; and FIG. 6 is a flowchart of operation of a variable delay circuit in the apparatus shown in FIG. 4.

DETAILED DESCRIPTION OF THE PREFERRED EMBODIMENTS

Figure 1:
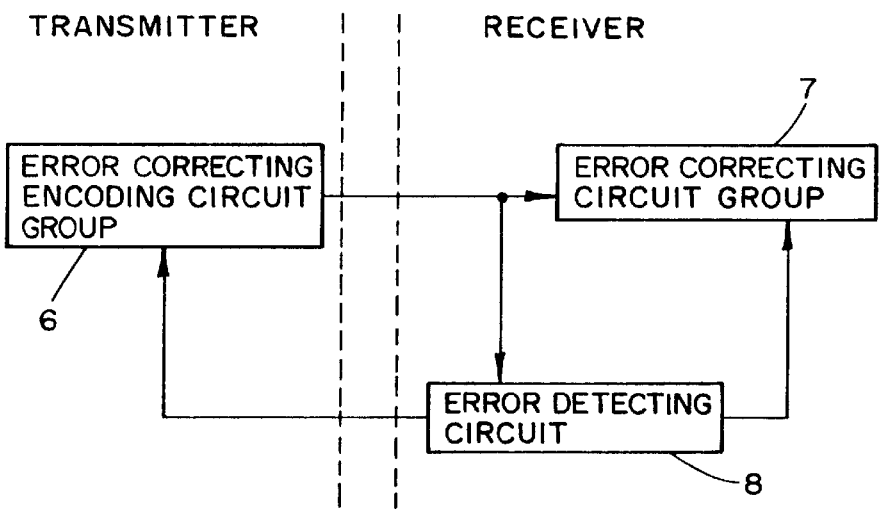
FIG. 1 is a block diagram of a first conventional data transfer system.
Figure 2:
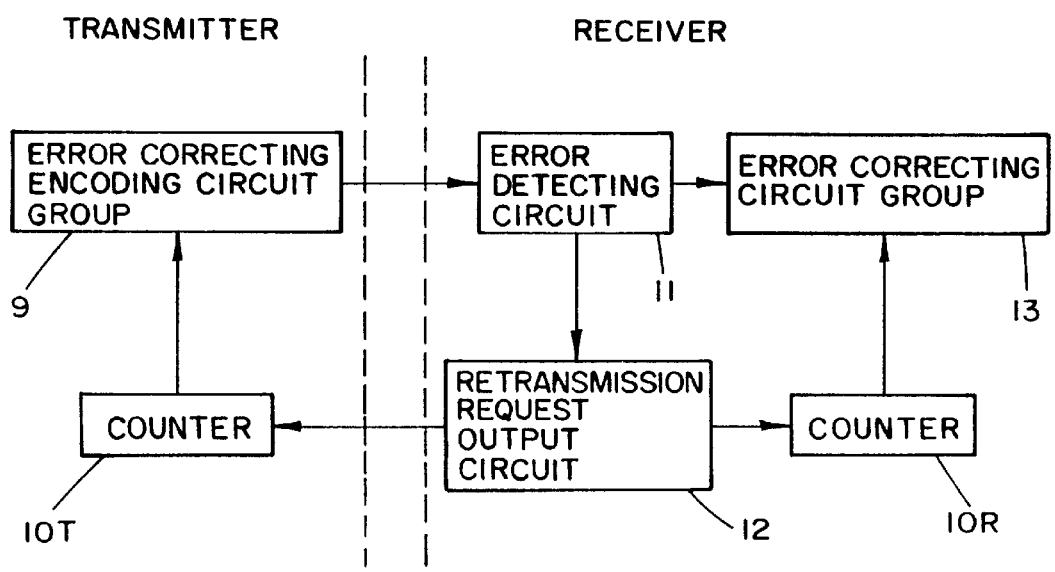
FIG. 2 is a block diagram of a second conventional data transfer system.
Figure 3:
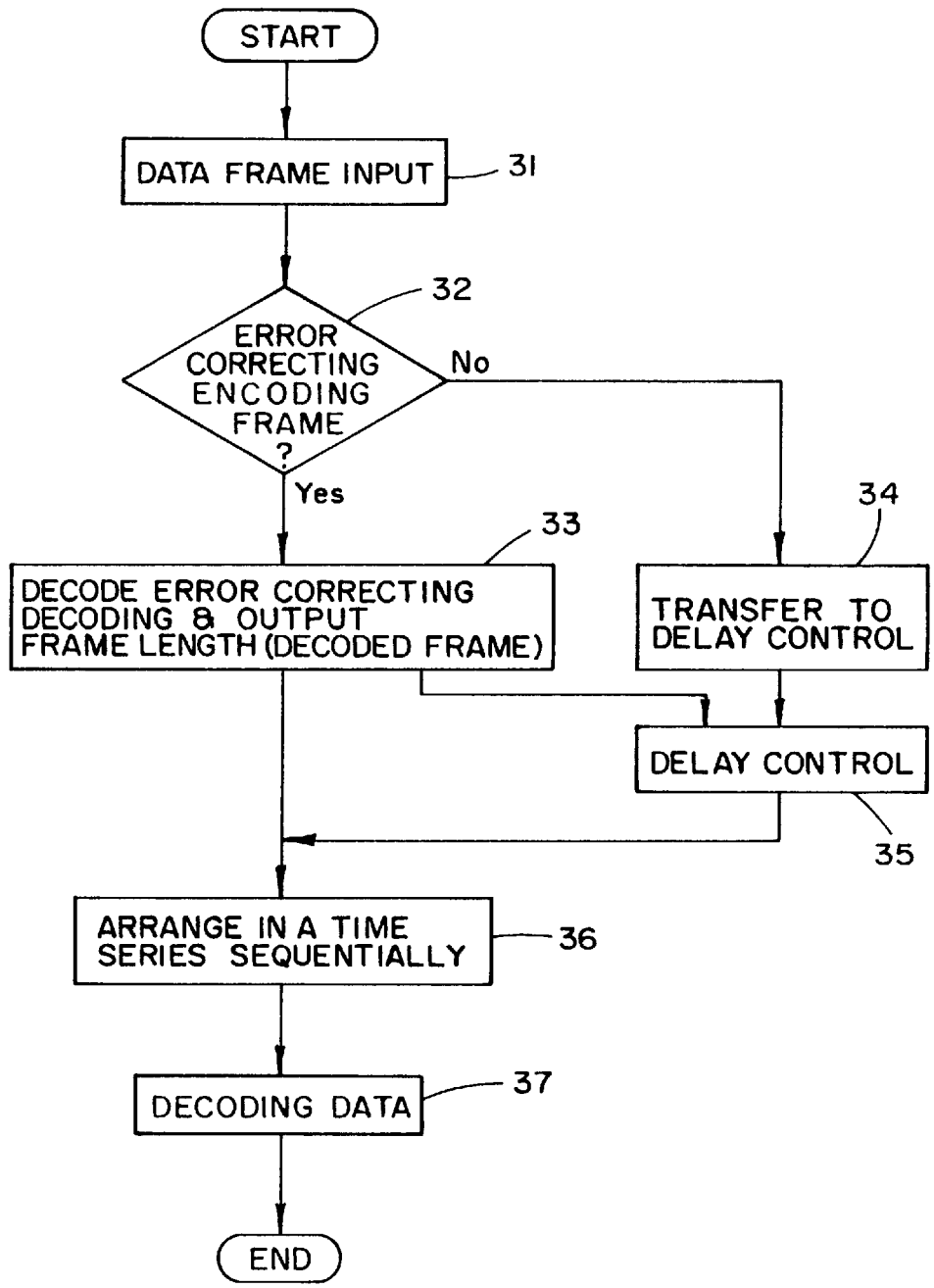
FIG. 3 is a flowchart of a processing sequence illustrating a method of transferring data according to the present invention.

FIG. 3 shows a processing sequence illustrating a method of transferring data according to the present invention.

In the method of transferring data according to the present invention, a transmitter selectively encodes data with an error correcting code depending on the state of congestion of a transmission path, multiplexes decision information indicative of whether data are encoded or not with a data frame, and transmits the data frame. As shown in FIG. 3, when a receiver receives the data frame in a step 31, the receiver determines whether the received data frame is a frame of data which have been encoded with an error correcting code or not based on the multiplexed decision information (step 32). If the receiver determines that the received data frame is a frame of data which have been encoded with an error correcting code, then the receiver decodes the data from the error correcting code, and outputs a frame length containing the decoded data (step 33).

If the receiver determines that the received data frame is a frame of data which have not been encoded with an error correcting code (step 32), then the receiver transfers the received data frame for a delay process (step 34). In the delay process in the step 34, the received data frame is delayed for the length of a preceding data frame which has been decoded from the error correcting code. Thereafter, the delayed data frame is arranged in a time series following the preceding decoded data frame (step 36), and the data of the data frame are decoded (step 37).

Figure 4:
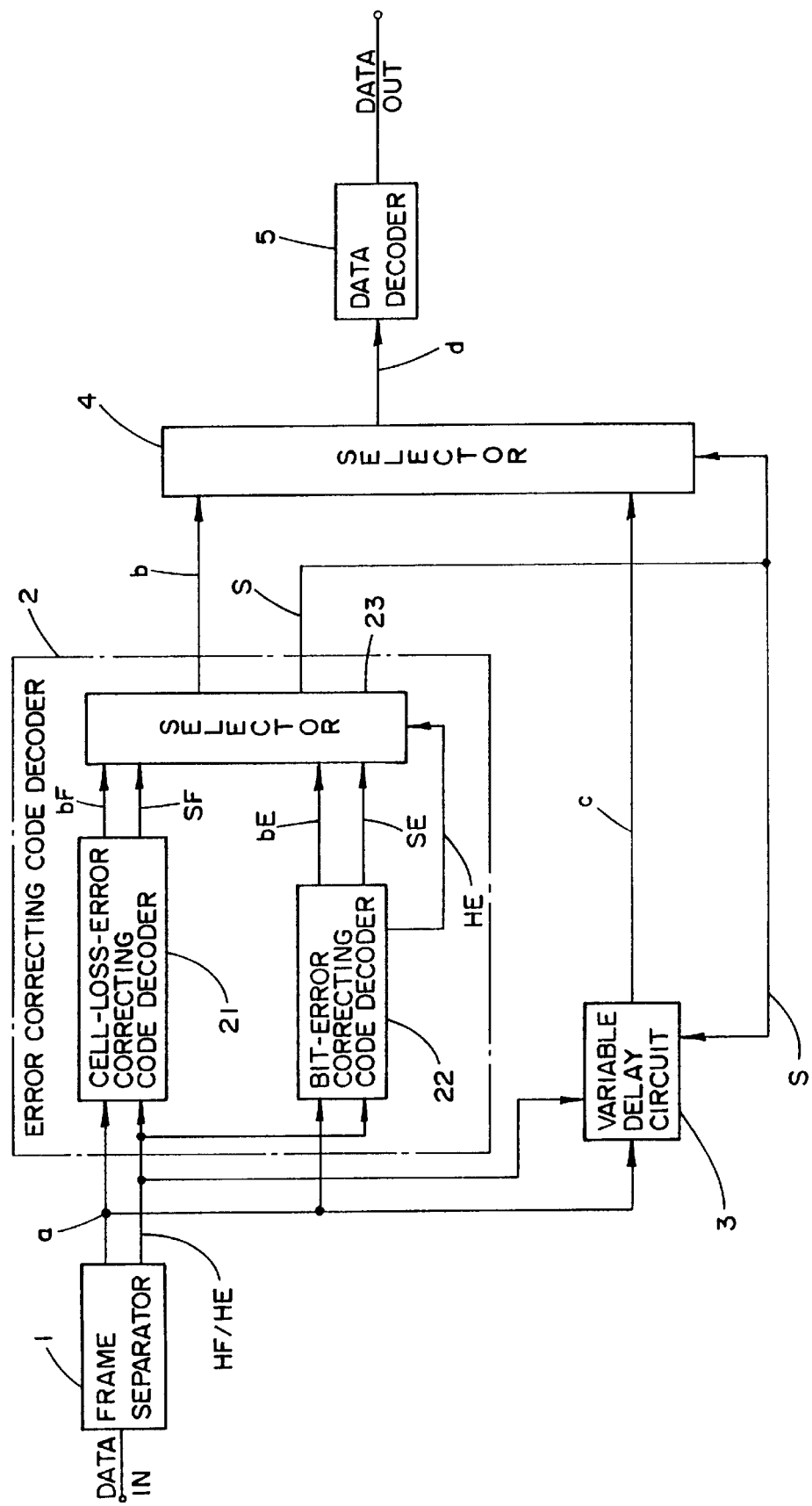
FIG. 4 is a block diagram of a receiver of an apparatus for transferring data according to the present invention.

FIG. 4 shows a block diagram of an apparatus for transferring data according to the present invention.

As shown in FIG. 4, a receiver of the apparatus has a frame separator 1 for separating frames of data which have been encoded with an error correcting code and frames of data which have not been encoded with an error correcting code, based on decision information in signals HF, HE, as illustrated in FIG. 5, which are multiplexed with received data frames and indicates whether the received data frames have been encoded with an error correcting code or not, error correcting code decoder 2 for decoding those data frames which have been encoded with an error correcting code from the error correcting code, variable delay circuit 3 for delaying those data frames which have not been encoded with an error correcting code by the length of a preceding data frame which has been decoded from the error correcting code, selector 4 for arranging decoded data frames which have been encoded with an error correcting code and delayed data frames which have not been encoded with an error correcting code in a time series sequentially and outputting the arranged data frames, and data decoder 5 for decoding the data frames outputted from selector 4 into original data.

Operation of the apparatus for transferring data according to the present invention will be described below.

FIG. 5(a) shows a data frame used in the apparatus for transferring data according to the present invention, and FIG. 5(b) shows a time sequence of changes of signals in a data frame.

In the apparatus for transferring data according to the present invention, a transmitter transmits a data frame containing variable encoded data with multi-plexed decision information HF, HE as shown in FIG. 5(a). The data frame has a header containing unique word information for establishing frame synchronization. The decision information HF, HE follows the header. The data frame also has a redundant bit section that is added when the data are encoded with an error correcting code. The decision information HF, HE is set to values, described below, depending on the congestion and a bit error rate of the network.

(1) The decision information HF is set to a high level "H" and the decision information HE is set to a low level "L" with respect to a data frame which has been encoded with an error correcting code for a cell loss due to congestion.

(2) The decision information HF is set to a low lever "L" and the decision information HE is set to a high level "H" with respect to a data frame which has been encoded with an error correcting code for a bit error.

(3) Both the decision information HF, and decision information HE are set to a low level "L" with respect to a data frame which has not been encoded with an error correcting code.

When the data frame is supplied from an input terminal DATA IN to frame separator 1, frame synchronization is established, and thereafter the data frame is separated into the header, the decision information HF, HE, the encoded data, and the redundant bit section.

Frame separator 1 deletes the information of the header, and separately outputs the decision information HF, HE, the encoded data, and the redundant bit section. In FIG. 5(b), "DATA IN" represents the data supplied to frame separator 1, "a" the encoded data and the redundant bit section, and "HF", "HE" the decision information, "D1"–"D7" encoded data, and "R" a redundant bit added when the data are encoded with an error correcting code. No redundant bit is added to encoded data contained in a data frame which has not been encoded with an error correcting code. Such encoded data are indicated by D2, D3.

Unit time T shown in FIG. 5(b) is a maximum time required to decode data from the error correcting code. In FIG. 5(b), Tn (n =1, 2, ---, 9) represents a time sequence composed of unit time T.

The encoded data and the decision information HF, HE shown in FIG. 5(a) are supplied to error correcting code decoder 2 and variable delay circuit 3.

Error correcting code decoder 2 comprises cell-loss-error correcting code decoder 21, bit-error correcting code decoder 22, and selector 23 for alternatively selecting one of output signals from cell-loss-error correcting code decoder 21 and bit-error correcting code decoder 22.

Cell-loss-error correcting code decoder 21 decodes data from the error correcting code for recovering a cell loss, and produces a decoded output signal bF. Cell-loss-error correcting code decoder 21 also generates and outputs a data length signal SF indicative of the length of the decoded data. Cell-loss-error correcting code decoder 21 operates when the decision information HF is of a high level "H" and the decision information HE is of a low level "L".

Bit-error correcting code decoder 22 decodes data from the error correcting code for recovering bit errors, and produces a decoded output signal bE. Bit-error correcting code decoder 22 also generates and outputs a data length signal SE indicative of the length of the decoded data. Bit-error correcting code decoder 22 operates when the decision information HF is a low level "L" and the decision information HE is a high level "H".

Selector 23 alternatively selects and outputs the decoded output signal bF, bE and the data length signal SF, SE. A control signal for the selector 23 may be either the decision information HF or the decision information HE. In the embodiment shown in FIG. 4, the decision information HE is applied as a control signal to selector 23.

Error correcting code decoder 2 decodes only those supplied encoded data, indicated by D1, D4, D5 in FIG. 5(b), which are to be decoded, from the error correcting code for either a cell loss or a bit error based on the simultaneously supplied decision information HF, HE. A process for decoding the encoded data from the error correcting code may be a combination of an RS (128, 124) Reed-Solomon decoding process and an interleave process as specified by ITU-T Recommendations I.363. Each of the variable data shown in FIG. 5(a) and indicated by "a" in FIG. 5(b) has a variable length. In order to decode such variable-length data from the error correcting code such as a Reed-Solomon code, fixed-length data having a necessary length are assumed, and a data portion corresponding to the difference between the fixed-length data and actual variable-length data is assumed to contain data "0".

Error correcting code decoder 2 outputs decoded output data b selected from the decoded output signals bF, bE, and also outputs a data length signal S selected from the data length signals SF, SE as indicating the effective data period of the decoded data.

FIG. 5(b) shows the decoded output data indicated by "b" and the data length signal indicated by "S". In FIG. 5(b), the signal S represents effective data when it is of a high level "H". The decoded output data indicated by "b", and the data length signal indicated by "S" in FIG. 5(b) correspond respectively to the signals b, S shown in FIG. 4.

Variable delay circuit 3 delays, for a variable period of time, only those supplied encoded data, indicated by D2, D3, D6, D7 in FIG. 5(b), which are not to be decoded from the error correcting code based on the simultaneously supplied decision information HF, HE.

The encoded data are delayed by variable delay circuit 3 as follows:

If it is assumed that preceding data, e.g., the data D1 in FIG. 5(b), are to be decoded from the error correcting code, then based on the data length signal S indicative of an effective data period which is outputted from error correcting code decoder 2, variable delay circuit 3 starts outputting the supplied encoded data at the same time that error correcting code decoder 2 has finished its error correcting code decoding process and the outputting of the decoded data. FIG. 5(b) shows delayed output data at "c", which correspond to delayed output data c in FIG. 4.

The data D1 in FIG. 5(b) have been decoded from the error correcting code, and are delayed for the unit time T as indicated by "b". The data D2 are delayed for a delay time equivalent to the effective data length of the data D1. Since the delay time of the data D2 is decreasable the length of the redundant bits added to the data D1, it is possible to make the delay time smaller than the unit time T. With respect to the data D5, D6, since the data D5 have a data length smaller than the data D1, the delay time of the data D6 is much smaller than the data D2. If frames which are not decoded from the error correcting code, such as D2, D3, D6, D7, are successively trained, or if there is a period without encoded data, no delay time is produced, i.e., data are transmitted passing over variable delay circuit 3.

FIG. 6 shows the above operation of variable delay circuit 3. When input data are supplied (step 101), variable delay circuit 3 determines whether the supplied data are to be decoded from the error correcting code based on the simultaneously supplied decision information HF, HE (step S102). If either decision information HF, HE is high level "H", then since the data are to be decoded from the error correcting code, variable delay circuit 3 ignores the supplied data (step 103). If both decision information HF, HE are low level "L", indicating that the data are not to be decoded from the error correcting code, then variable delay circuit 3 checks the data length signal S (step 104). The supplied data are stored in a buffer during which the signal S is kept "H" (step 105). Since the data remain stored until the data length signal S becomes "L" level, the delay time shown in FIG. 5(b) is controlled appropriately. When the data length signal S becomes "L" level, variable delay circuit 3 outputs the stored data as output data (step 106). Then input of next data is checked (step 107). Thereafter, the steps 104–107 are repeated with respect to next supplied data. If there are no supplied data, then variable delay circuit 3 waits for input data (step 108).

Selector 4 selects and outputs either output data b (indicated by b in FIGS. 4 and 5(b)) from the error correcting code decoder 2 or output data c (indicated by c in FIGS. 4 and 5(b)), which are not decoded, from the variable delay circuit 3, based on a data length signal S (indicated by S in FIGS. 4 and 5(b)) from the error correcting code decoder 2, the data length signal S representing a data effective period within which the data have been decoded from the corresponding error correcting code.

In the example shown in FIG. 5(b), when the data length signal S becomes "H" in level, the selector 4 selects and outputs the output signal b from error correcting code decoder 2. FIG. 5(b) shows the data "d" outputted from the selector 4, which correspond to an output data d in FIG. 4.

Finally, the data decoder 5 decodes the output data from the selector 4 into original data, and out-puts the decoded data to output terminal DATA OUT.

According to the process as described above, data, such as data D2, D3, D6 shown in FIG. 5(b), which are not to be decoded from the error correcting code do not require redundant bits to be associated therewith, and can be transmitted with as small delay as possible or no delay at all.

With the arrangement of the present invention, as described above, the transmitter encodes selectively or does not encode a data frame to be transmitted with an error correcting code depending on the congestion and appearance of bit errors of the transmission path, and the receiver determines whether the received data frame has been encoded with an error correcting code or not based on decision information sent with the data frame. The receiver decodes a data frame which has been encoded with an error correcting code, and adds a data frame which has not been encoded with an error correcting code in a time series sequentially, and then decodes the data frame into original data. Therefore, the receiver can receive and process data independently without communication with the transmitter. Accordingly, data can be transferred at an increased transfer rate, and can be decoded from the error correcting code even in one-way communications for efficient data transfer.

While a preferred embodiment of the present invention has been described using specific terms, such description is for illustrative purposes only, and it is to be understood that changes and variations may be made without departing from the spirit or scope of the following claims.

What is claimed is:

1. A method of data transmission transferring data with decision information which indicates whether the data have been encoded with an error correcting code having a redundant bit or not, comprising the steps of:

transmitting data at a high speed without an error encoding process, or transmitting data at a lower speed with an error encoding process for bit errors or with an error encoding process for cell loss;

adding a code to the transmitted data indicating whether data have been encoded with an error correcting code for preventing a cell loss or a bit error, to the decision information at a transmitter;

checking the decision information at a corresponding receiver to determine whether the received data have been encoded with an error correcting code or not;

decoding the data from the error correcting code and outputting the decoded data and frame length information indicative of the length of the data frame after the data have been decoded;

delaying received data which have been encoded without an error correcting code, for the frame length corresponding to the frame length information of a preceding data frame at the receiver;

arranging and outputting the decoded data and the delayed data in a time series sequentially; and decoding the data arranged and outputted in the time series into original data.

2. A method according to claim 1, wherein said step of decoding the data from the error correcting code comprises the step of alternatively decoding the data from error correcting codes for preventing a cell loss with respect to asynchronous transfer mode and packet cells and a bit error.

3. An apparatus of data transmission transferring data with decision information which indicates whether the data have been encoded with an error correcting code having a redundant bit or note comprising:

means for transmitting data at a high speed without an error encoding process, or transmitting data at a lower speed with an error encoding process for bit errors or with an error encoding process for cell loss;

means for adding a code to the transmitted data indicating whether data have been encoded with an error correcting code for preventing a cell loss or a bit error, to the decision information at a transmitter;

means for checking the decision information at a corresponding receiver to determine whether the received data have been encoded with an error correcting code or not;

means for decoding the received data with the error correcting code and outputting the decoded data and frame length information indicative of the length of the data frame after the data have been decoded;

means for delaying received data which have been encoded without an error correcting code, for the frame length corresponding to the frame length information of a preceding data frame at the receiver;

means for arranging and outputting the decoded data and the delayed data in a time series sequentially; and means for decoding the data arranged and outputted in the time series into original data.

4. An apparatus according to claim 3, wherein said means for decoding the data from the error correcting code comprises means for decoding the data from the error correcting code comprising the step of alternatively decoding the data from error correcting codes for preventing a cell loss with respect to asynchronous transfer mode and packet cells and a bit error.

5. An apparatus according to claim 3, wherein said means for decoding the data from the error correcting code comprises a cell-loss-error correcting code decoder, a bit-error correcting code decoder, and a selector for alternatively selecting and outputting either the output signals from the cell-loss-error correcting code decoder or the bit-error correcting code decoder corresponding to the decision information.

* * * * *

UNITED STATES PATENT AND TRADEMARK OFFICE
CERTIFICATE OF CORRECTION

PATENT NO. : 5,856,988
DATED : January 5, 1999
INVENTOR(S) : Takashi Kiriyama

It is certified that error appears in the above-identified patent and that said Letters Patent is hereby corrected as shown below:

Column 1, Line 45: "prescribed by (International..." should read --prescribed by ITU-T (International...--

Column 8, Line 4, Claim 3: note" should read --not--

Signed and Sealed this

Twenty-ninth Day of August, 2000

Attest:

Q. TODD DICKINSON

*Attesting Officer*           *Director of Patents and Trademarks*